United States Patent
Srinivasan et al.

(10) Patent No.: US 6,717,856 B2
(45) Date of Patent: Apr. 6, 2004

(54) METHOD AND APPARATUS FOR SEN-REF EQUALIZATION

(75) Inventors: Balaji Srinivasan, Fair Oaks, CA (US); Sandeep Guliani, Folsom, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/896,446

(22) Filed: Jun. 30, 2001

(65) Prior Publication Data

US 2003/0002342 A1 Jan. 2, 2003

(51) Int. Cl.[7] .............................................. G11C 16/06
(52) U.S. Cl. .............................. 365/185.21; 365/185.2; 365/185.25
(58) Field of Search ........................ 365/185.2, 185.21, 365/185.25, 185.33, 210, 203

(56) References Cited

U.S. PATENT DOCUMENTS

| | | | | |
|---|---|---|---|---|
| 4,884,241 A | * | 11/1989 | Tanaka et al. .............. | 365/210 |
| 5,305,273 A | * | 4/1994 | Jinbo ..................... | 365/185.21 |
| 5,519,652 A | * | 5/1996 | Kumakura et al. .... | 365/185.21 |
| 5,559,737 A | * | 9/1996 | Tanaka et al. ......... | 365/185.25 |
| 5,594,691 A | * | 1/1997 | Bashir ................... | 365/185.03 |
| 6,307,797 B1 | * | 10/2001 | Fournel et al. ............. | 365/203 |

* cited by examiner

*Primary Examiner*—Son Mai
(74) *Attorney, Agent, or Firm*—Blakely, Sokoloff, Taylor & Zafman LLP

(57) ABSTRACT

In one embodiment, the invention is an apparatus. The apparatus includes a first drain bias network having an input suitable to couple to a FLASH cell. The apparatus also includes a second drain bias network having an input suitable to couple to a FLASH cell. The apparatus further includes an equalization circuit having a first node coupled to the input of the first drain bias network and having a second node coupled to the input of the second drain bias network and having a control signal to control operation of the equalization circuit.

33 Claims, 9 Drawing Sheets

METHOD AND APPARATUS FOR SEN-REF EQUALIZATION

BACKGROUND OF THE INVENTION

1. Field of the Invention

The invention generally relates to memory technology and more specifically relates to sense amplifiers in FLASH memory devices.

2. Description of the Related Art

Most memory technology employs sense amplifiers. These sense amplifiers are typically designed for low current inputs with high gain and rapid response times. However, memory technology also often involves selecting a particular cell and letting that cell pull a node down or up, to a different value from what the node is biased to when no cell is selected. That node is typically the input node of the sense amplifier. As a result, the fastest sense amplifier is of little use if the input node can only be pulled to a different voltage slowly by the memory cell.

One method for providing a memory cell that can rapidly pull a node up or down is to use a large transistor in the memory cell, thus allowing for high current which may pull the node to the desired voltage. However, the larger the transistor, the more space the memory cell requires, and therefore the lower the density of memory cells can be on a given memory chip. Furthermore, a larger transistor may have increased capacitive coupling effects which will lead to a slower transition from a non-conductive to a conductive state, resulting in a property of the larger transistor defeating the purpose of having the larger transistor.

Beyond problems with how quickly a node may be pulled down or up, problems may arise when comparing a reference cell and memory cell response due to settling time on the inputs to the sense amplifier. If the reference cell has a greater effect on the reference input node initially than the memory cell has on the sense input node, then the sense amplifier may generate a signal which is false early in the cycle, before the sense input node transitions properly. This means that the delay associated with the sense amplifier may be longer than would otherwise be expected or preferable.

BRIEF DESCRIPTION OF THE DRAWINGS

The present invention is illustrated by way of example and not limitation in the accompanying figures.

DETAILED DESCRIPTION

Figure 1:
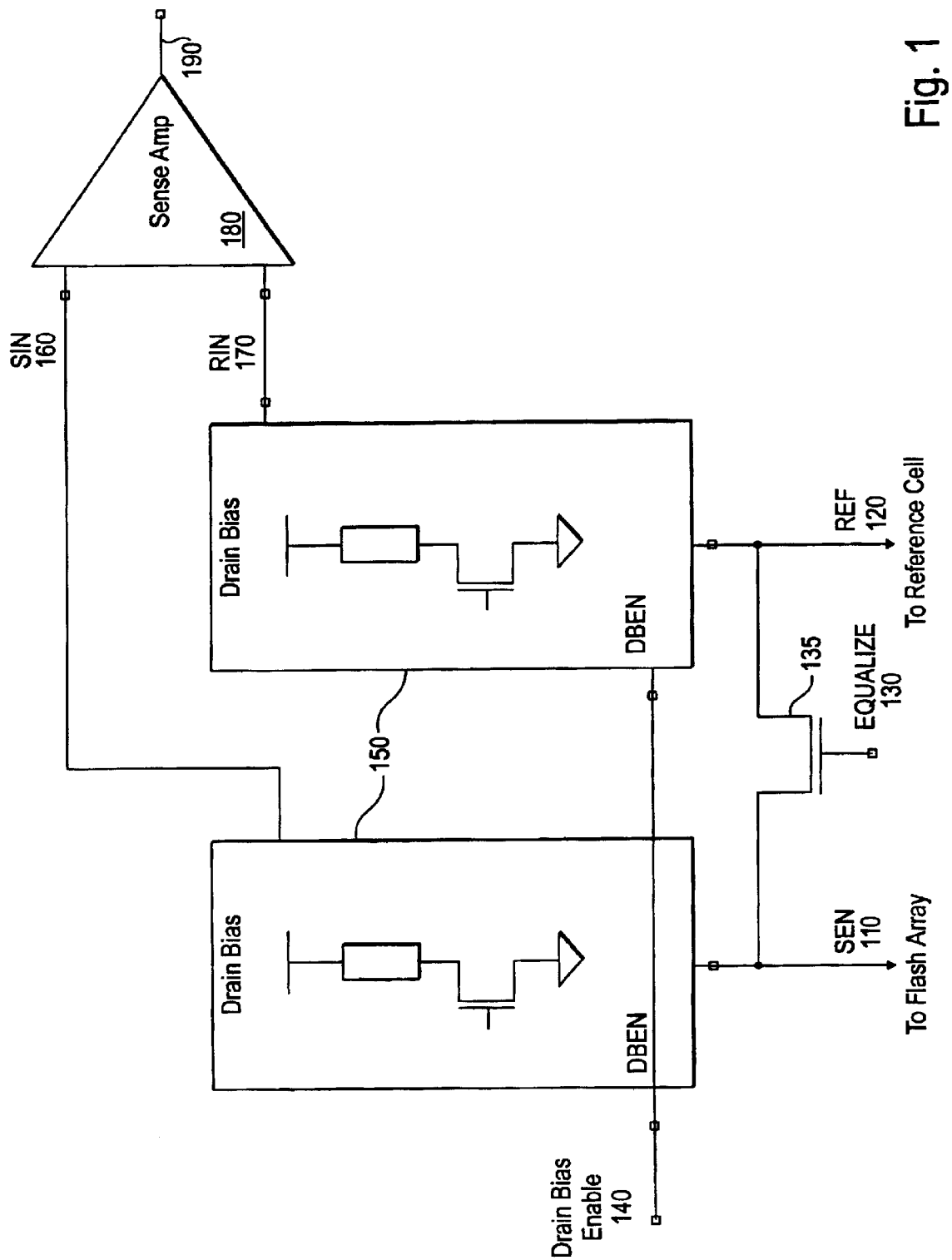
FIG. 1 illustrates an embodiment of sensing circuitry suitable for use with a FLASH cell.

A method and apparatus for sen-ref equalization is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment. Likewise, alternative or separate embodiments are not necessarily mutually exclusive of other embodiments.

The low voltage sensing in FLASH memories is carried out through use of a common mode current mirror (current source) and kicker circuitry in the sensing circuitry. The common mode current mirror provides current generally sufficient to satisfy the current drain from the bias network, and the kicker circuitry provides additional pullup current (charge) relative to the current supplied by the column load in the sensing circuitry. By providing both of these additional elements, the column load may be sized and designed as a more resistive load suitable for providing a significant voltage swing between a high and a low voltage on a FLASH cell.

The voltage swing between the high and the low voltage on the FLASH cell is sensed by the actual sense amplifier, and amplifiers generally perform better with increased voltage differentials on the inputs of the amplifier. In a FLASH design, the sense amplifier may sense the difference between a reference FLASH cell and a FLASH cell to be sensed. The voltage swing has an effect on the difference between the voltages produced by the relatively stable reference FLASH cell and the FLASH cell to be sensed. The voltage produced by the FLASH cell to be sensed may differ more from the voltage produced by the reference FLASH cell.

As will be appreciated, transient or bias differences between the sense and reference inputs of the sense amplifier can prolong the time needed to achieve a stable output from the sense amplifier. Additionally, settling time on the inputs of the sense amplifier can similarly prolong the time needed to achieve a stable output on the sense amplifier. As such, equalizing the inputs prior to allowing the FLASH cell to be sensed and the reference FLASH cell can be useful to reduce the time needed to achieve the desired stable output on the sense amplifier.

Note that the invention is described with reference to embodiments incorporating FLASH cells which are known to those skilled in the art. However, it will be appreciated that other forms of persistent memory storage locations (such as EPROM cells for example) may be utilized in conjunction with the invention without exceeding the spirit and scope of the invention. A persistent memory storage location, such as a FLASH cell, typically may be programmed to store a 'one' or a 'zero' which represents a binary digit or bit. The actual 'one' or 'zero' as stored in the persistent memory storage location may be stored as a charge level or some other measurable property of the persistent memory storage location.

Illustrated in FIG. 1 is an embodiment of sensing circuitry for a FLASH cell array. Sense input 110 is coupled to a FLASH cell to be sensed (not shown). Ref input 120 is coupled to a FLASH reference cell (also not shown). Equalize signal 130 is coupled to a first or gate node of a transistor 135. Transistor 135 has a second node coupled to sense input 110 and a third node coupled to ref input 120. Thus, equalize signal 130 may be used to control whether sense input 110 is coupled to ref input 120, thereby allowing for equalization between sense input 110 and ref input 120.

First and second drain bias networks 150 are each coupled to sense input 110 and ref input 120 respectively, and each network 150 is controlled by a common drain bias enable input 140. The first drain bias network 150 produces a SIN signal 160 which represents an input to the sense amplifier 180 corresponding to the sense input 110. The second drain bias network 150 produces a RIN signal 170 which represents an input to the sense amplifier 180 corresponding to the ref input 120. The drain bias networks 150 operate to make the output of a FLASH cell to be sensed (or a reference FLASH cell) into an output suitable for use as an input to a differential amplifier such as sense amplifier 180. In one embodiment, a FLASH cell output can be measured as a current, and the drain bias network operates to convert this current to a voltage for sensing purposes. Note, however, that this conversion does not change anything other than the manner of sensing of the value of the FLASH cell. Sense amplifier 180 compares the two inputs to produce a sense amplifier output 190.

By equalizing the sense input 110 and the ref input 120, the corresponding inputs to the sense amplifier 180 may be expected to rise and fall relatively closely. In particular, if the sense input 110 and the ref input 120 are equalized until the FLASH cell to be sensed and the reference FLASH cell are coupled thereto, one can expect that this equalization will tend to minimize changes in polarity of the voltage difference between the sense input 110 and the ref input 120 during the time for sensing those inputs. This implies that the sense amplifier 180 will not change its output 190 once it determines the polarity of the differential between the two inputs. This in turn leads to a faster stable output signal 190 from the sense amplifier 180.

Figure 2:
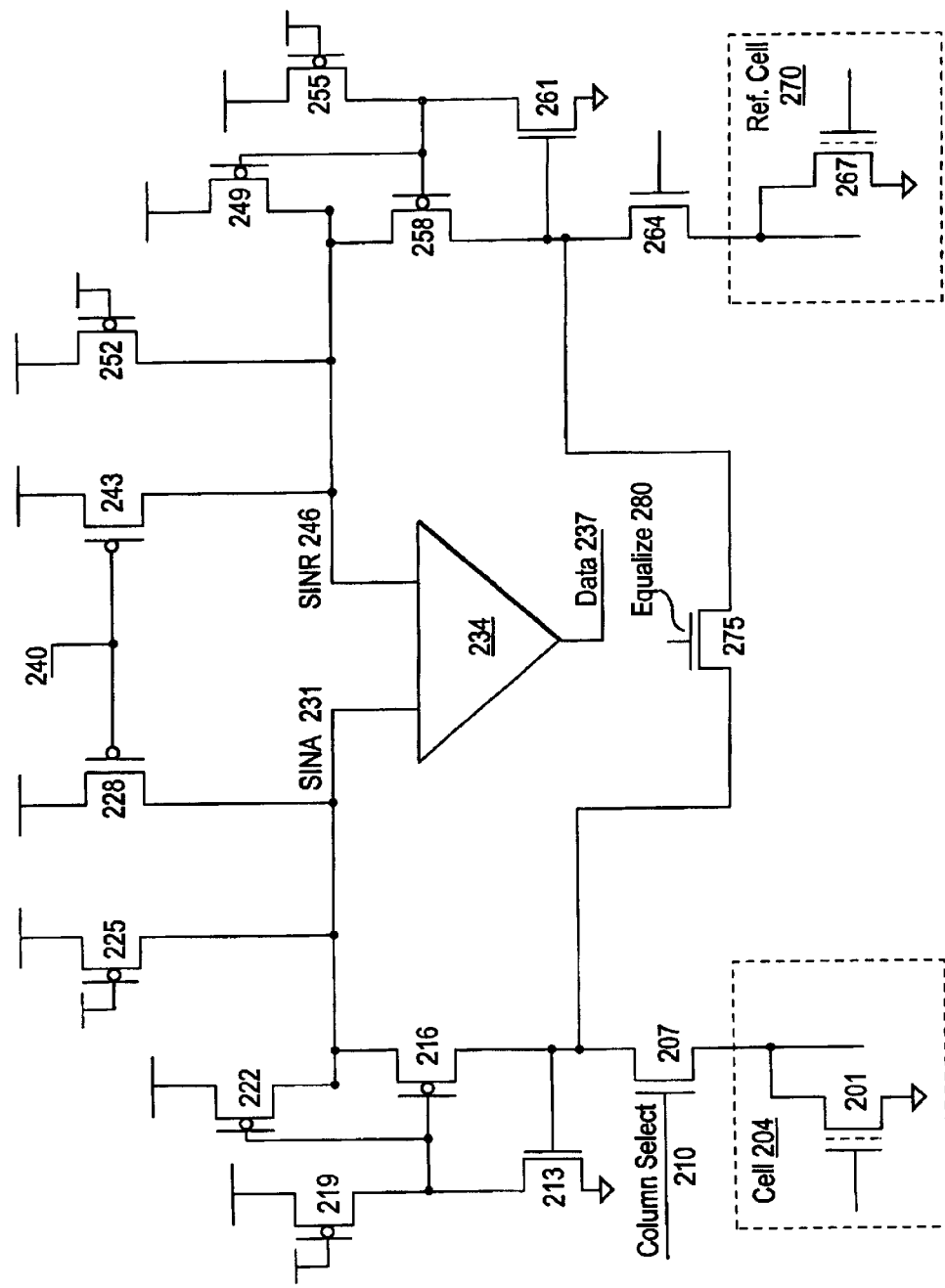
FIG. 2 illustrates an alternate embodiment of sensing circuitry suitable for use with a FLASH cell.

Turning to FIG. 2, an alternative embodiment of sensing circuitry and a FLASH cell is illustrated. FLASH cell 204 is made up of a floating gate NMOS transistor 201 coupled to ground at its first node and to a first node of column select NMOS transistor 207 at transistor 201's second node. Note that in most MOSFET transistors, a first or second node may be either a source or drain of the transistor, while in bipolar junction transistors the first or second node may be either a collector or emitter. Column select signal 210 is coupled to the gate of transistor 207. The second node of transistor 207 is coupled to the gate of transistor 213 and to the first node of transistor 216. The first node of transistor 213 is coupled to ground, and the second node of transistor 213 is coupled to the gate of transistor 216, the gate of transistor 222, and the first node of transistor 219. The second node of transistor 216 is coupled to the first node of transistor 222 and to the first node of transistor 225, and the node at which this coupling is made is referred to as SINA 231. The gate and the second node of transistor 219 are both coupled to a power supply such as Vcc. Likewise, the gate and the second node of transistor 222 and the gate and the second node of transistor 225 are coupled to a power supply.

Also coupled to the node SINA 231 is the second node of transistor 228 and the first input of sense amplifier 234. Coupled to the first node of transistor 238 and the first node of transistor 243 is a power supply. Coupled to the gate of transistor 228 and the gate of transistor 243 is current adjust input 240. Coupled to the first node of transistor 243 is node SINR 246. Node 246 is also coupled to the second input of sense amplifier 234, the first node of transistor 249, the first node of transistor 252, and the second node of transistor 258. The output of sense amplifier 234 is coupled to data 237.

The second node and gate of transistor 252 are coupled to a power supply, as is the second node of transistor 249. The gate of transistor 249 is coupled to the gate of transistor 258, the first node of transistor 255 and the second node of transistor 261. The first node of transistor 258 is coupled to the gate of transistor 251 and to the second node of transistor 264. The gate and the second node of transistor 255 are coupled to a power supply. The first node of transistor 261 is coupled to ground. The first node of transistor 264 is coupled to the second node of floating gate transistor 267. The first node of floating gate transistor 267 is coupled to ground. Reference cell 270 is formed by floating gate transistor 267, which is preferably programmed to serve as a reference voltage similar to that of a FLASH cell in either a programmed or erased configuration. Alternatively, reference cell 270 may be programmed to serve as a reference voltage nearly midway between a 'programmed' and an 'erased' voltage of a FLASH cell, thereby supplying a trip voltage to sense amplifier 234.

As illustrated in this embodiment, transistor 228 may be adjusted to provide current sufficient to satisfy most of the demand from transistor 216. As a result, transistor 225 may be implemented as the column load for cell 204. Similarly, transistor 243 may provide current sufficient to satisfy most of the demand from transistor 258, thus allowing transistor 252 to act as a column load for reference cell 270.

Equalization transistor 275 has a first node coupled to the first node of transistor 207, a second node coupled to the first node of transistor 264, and a third node coupled to equalize signal 280. In one embodiment, equalize signal 280 causes equalization transistor 275 to conduct until transistors 207 and 264 couple the cells (204, 270), thereby equalizing the inputs to the sense amplifier 234 prior to changes induced by the cells (204, 270) to be sensed. Also note that the exact connection of transistor 275 to other elements in the circuit is not necessarily crucial, so long as it can operate to equalize the inputs to the sense amplifier and thereby settle both the inputs and the corresponding output. Here, transistor 275 is connected to circuit elements near the inputs of the drain bias circuitry, but that need not be the only useful location within the circuit. Furthermore, layout positioning of transistor 275 may or may not be critical, depending on many other factors affecting circuit design as understood by those skilled in the art.

In one embodiment, transistors 228 and 243 provide common mode current necessary to run or power the drain bias circuitry. Transistors 225 and 252 provide the column load associated with the drain bias circuitry, and may be sized to achieve a highly resistive (and therefore sensitive) load to the cells 204 and 270. Transistors 213, 216, 219 and 222 provide a kicker which speeds up the stabilization of SINA 231 in response to a change at the first node of transistor 216, such as coupling of the cell 204. Similarly, transistors 249, 255, 258, and 261 provide a kicker which speeds up the stabilization of SINR 246 in response to a change at the first node of transistor 261, such as coupling of the cell 270. Transistors 213, 216, 219, 222, 225 and 228 thus make up a first drain bias circuit, and transistors 243, 249, 252, 255, 258 and 261 make up a second drain bias circuit.

Figure 3:
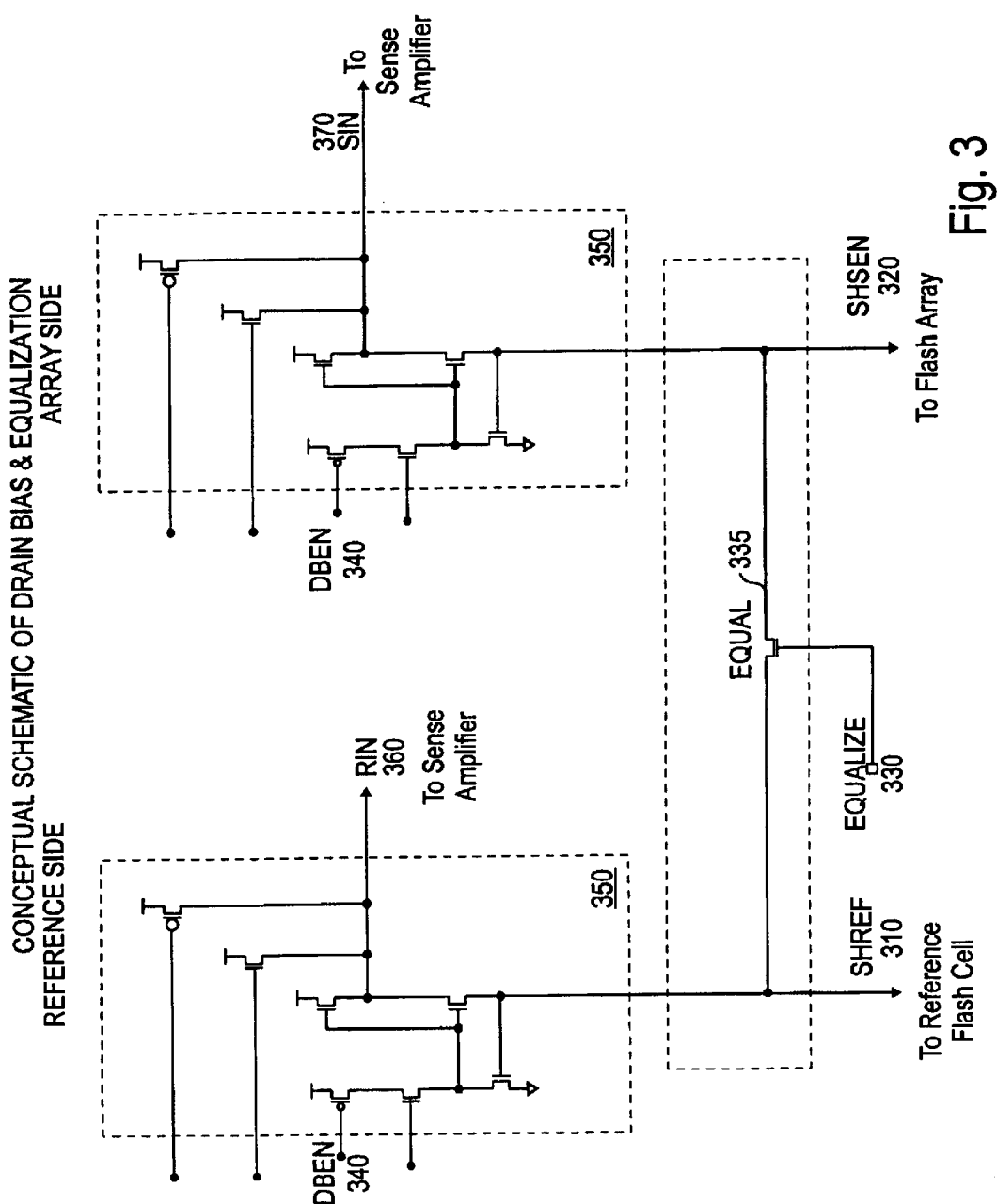
FIG. 3 illustrates another alternative embodiment of sensing circuitry suitable for use with a FLASH cell.

Illustrated in FIG. 3 is another alternative embodiment of sensing/biasing circuitry for use with a FLASH cell. SHREF signal 310 is suitable for coupling to a reference FLASH cell. SHSEN signal 320 is suitable for coupling to a FLASH cell to be sensed. Equal transistor 335 is coupled at a first node to the node of SHREF 310, at a second node to the node of SHSEN 320 and at a third node to the equalize signal 330. Two drain bias networks 350 are provided, one coupled to SHREF 310 and another coupled to SHSEN 320.

Each drain bias network 350 has a control input set 340 associated therewith, allowing for tuning of the drain bias networks. In one embodiment, the control input set 340 of the first drain bias network 350 is coupled to the same signals that are coupled to the control input set 340 of the second drain bias network 350, thereby assuring nearly identical operation of the circuits. Furthermore, the control input sets 340 may be used as enable inputs. One drain bias network 350 produces an output RIN 360 which is produced from the SHREF signal 310 and which is suitable for coupling to the reference input of a sense amplifier. The other drain bias network 350 produces an output SIN 370 which is produced from the SHSEN signal 320 and which is suitable for coupling to the sense input of a sense amplifier.

Figure 4A:
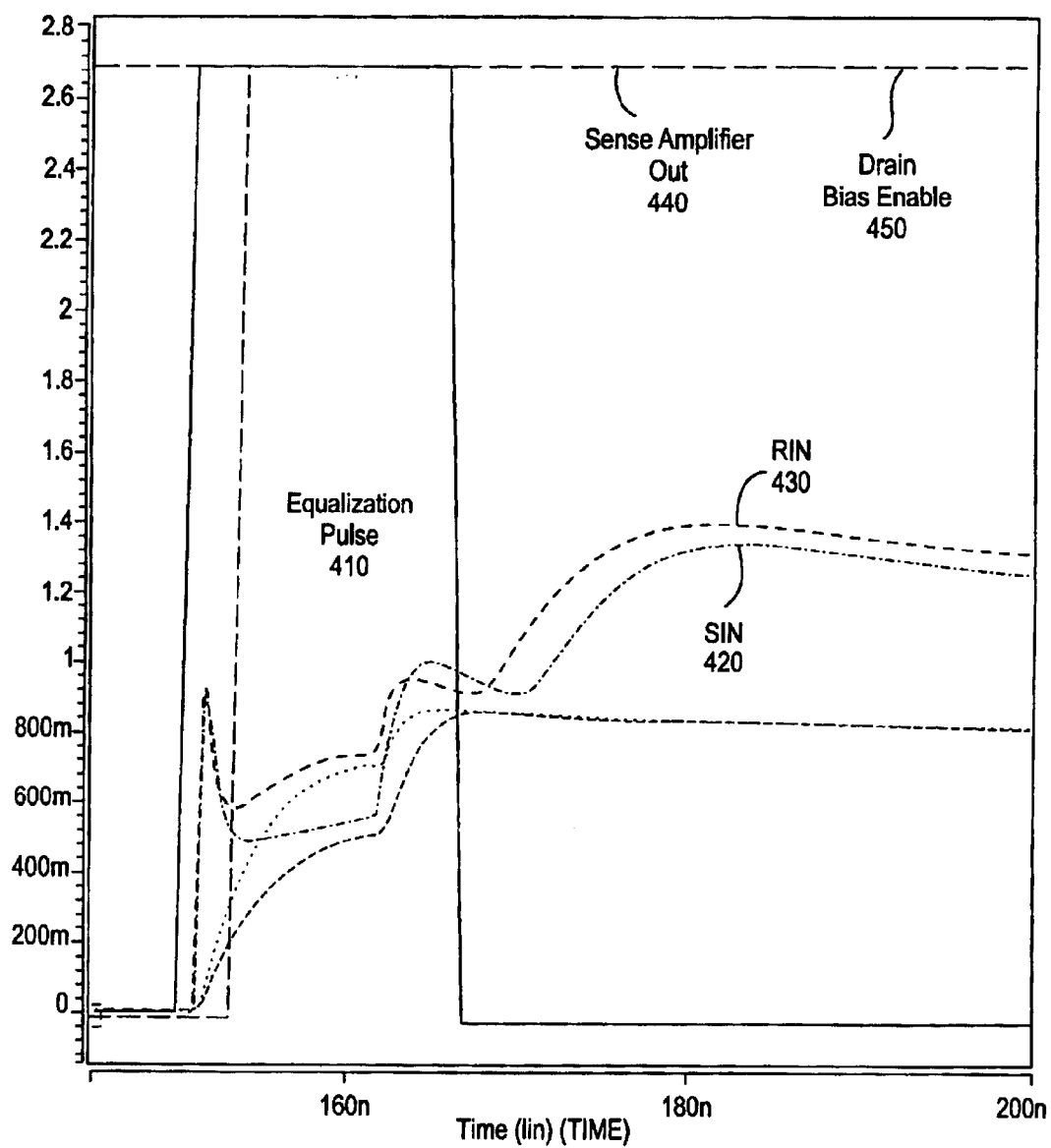
FIG. 4A illustrates a simulation of a FLASH cell such as the cell of FIG. 1.

Turning to FIG. 4A, an illustration of a simulation of sensing a FLASH cell programmed to a 'one' without an equalization pulse is provided. Note that the equalization pulse 410 is illustrated, for ease of comparison with simulations utilizing the equalization pulse. The drain bias enable signal 450 is illustrated as high (enabled in one embodiment). Furthermore, the sense amplifier out signal 440 is illustrated as high, since the inputs do not perturb the sense amplifier enough to cause the output to swing low. The RIN 430 and SIN 420 signals may be seen to rise and to cross each other several times. These signals are the inputs to the sense amplifier, and the time it takes for them to stabilize leads to the time necessary to achieve a stable output from the sense amplifier.

Figure 4B:
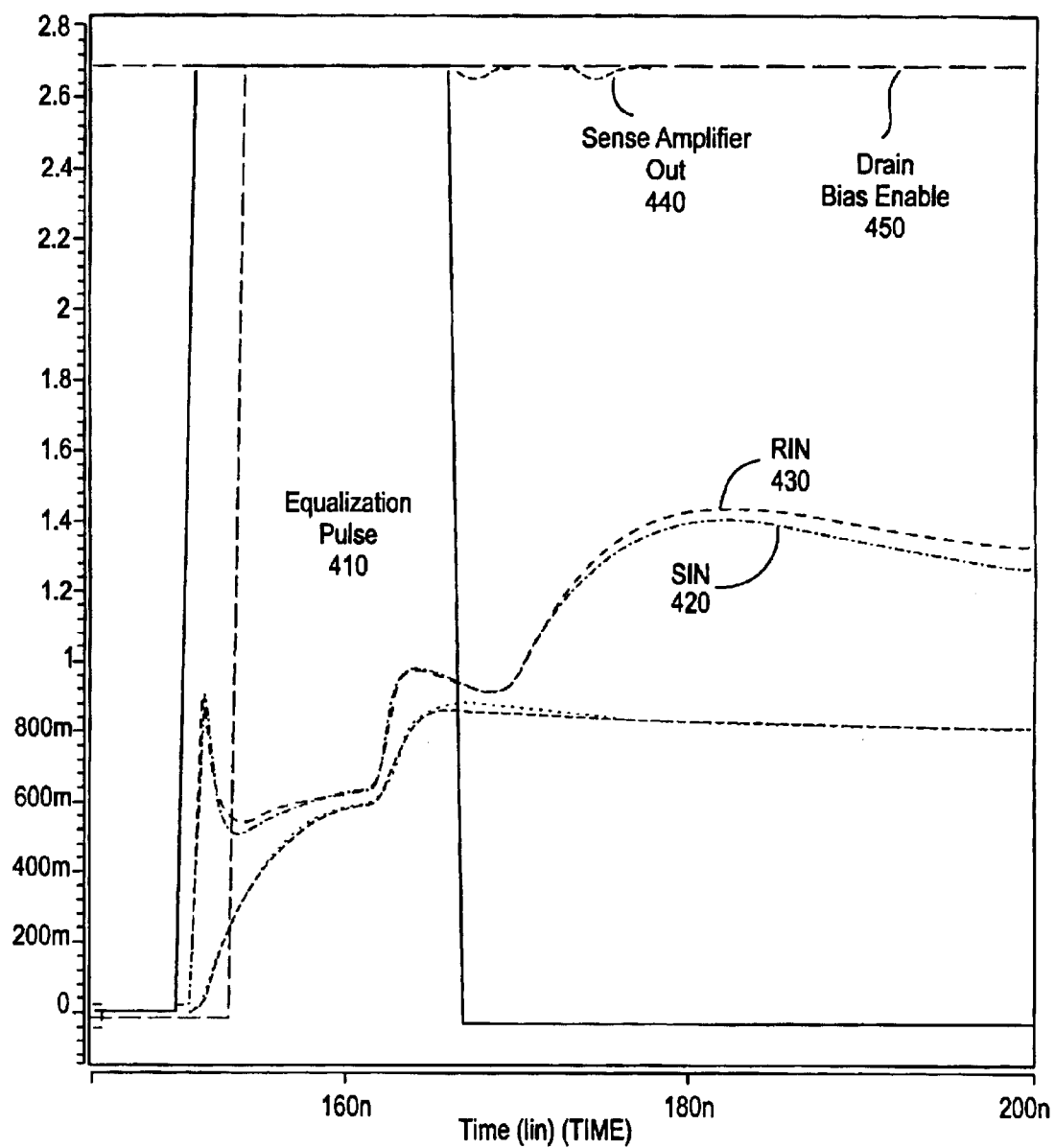
FIG. 4B illustrates a simulation of a FLASH cell such as the cell of FIG. 1.

Turning to FIG. 4B, an illustration of a simulation of sensing a FLASH cell programmed to a 'one' with an equalization pulse is provided. Note that in this simulation, the two signals RIN 430 and SIN 420 move in near lockstep due to the coupling of the equalization circuit, thus eliminating the crossover behavior seen in FIG. 4A. While the instability of the sense amplifier output 440 may be seen here, it is apparent that after the second dip on the output, the output may be expected to be stable.

Figure 4C:
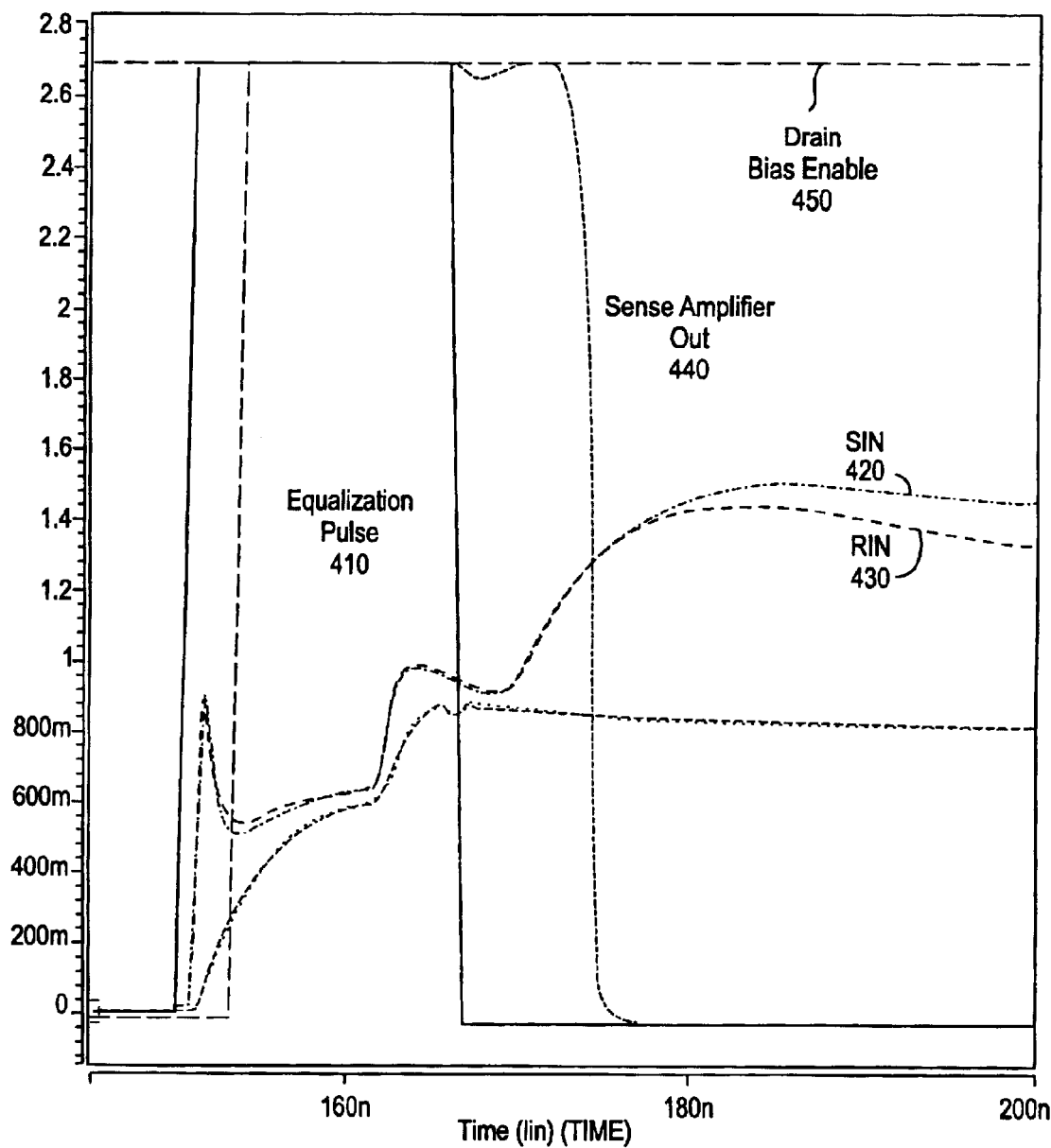
FIG. 4C illustrates a simulation of a FLASH cell such as the cell of FIG. 1.
Figure 4D:
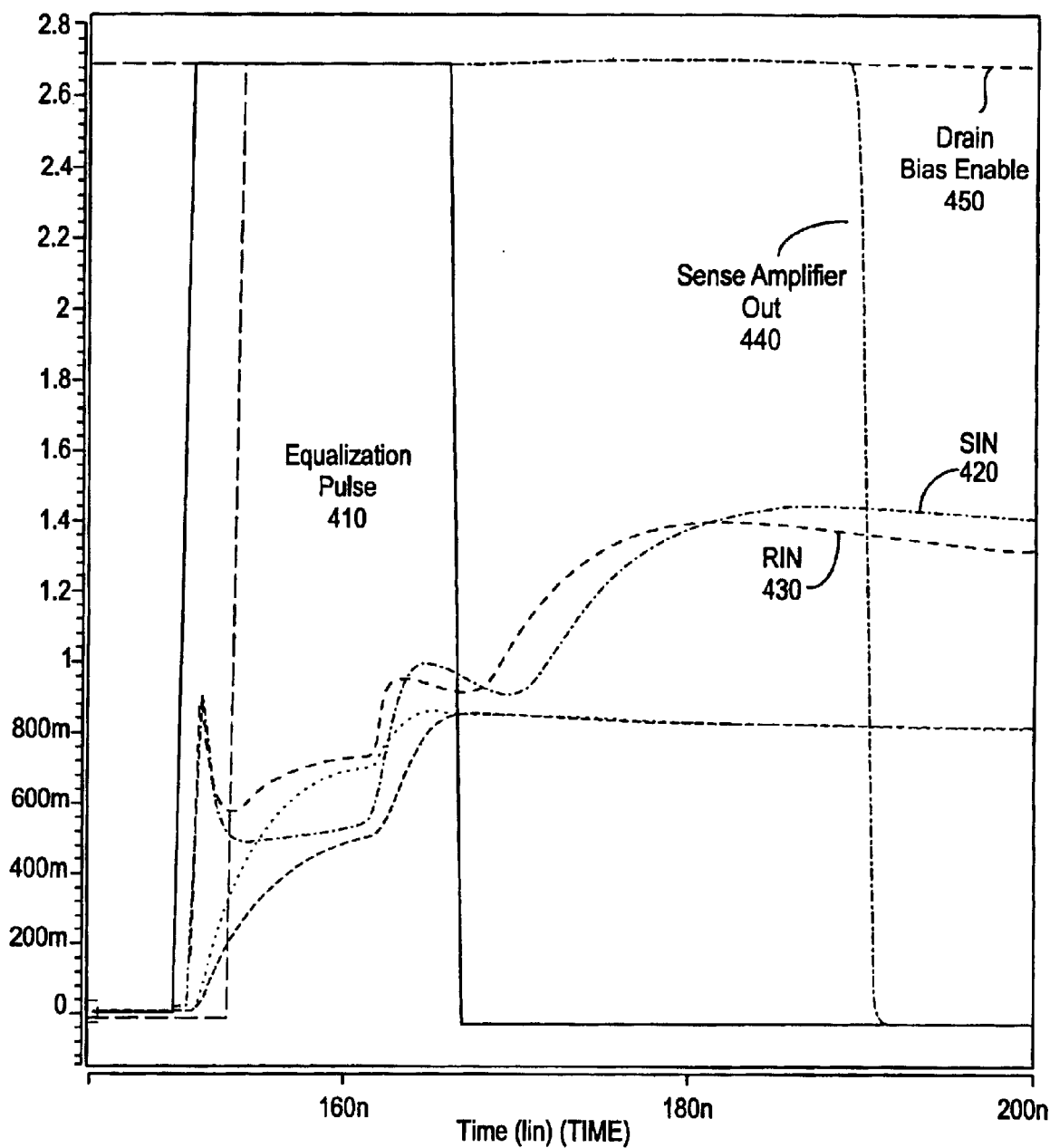
FIG. 4D illustrates a simulation of a FLASH cell such as the cell of FIG. 1.

Turning to FIG. 4C, an illustration of a simulation of sensing a FLASH cell programmed to a 'zero' with an equalization pulse is provided. Again, in this simulation, the two inputs RIN 430 and SIN 420 move in tandem during the equalization period, with only slight differences, and then separate in a monotonic manner with respect to the differential. No crossover behavior is illustrated. Turning to FIG. 4D, an illustration of a simulation of sensing a FLASH cell programmed to a 'zero' without an equalization pulse is provided. In this simulation, the crossover behavior of the SIN 420 and RIN 430 signals is repeated several times, causing a long delay before the sense amplifier output 440 is at a stable, useful value.

Figure 5:
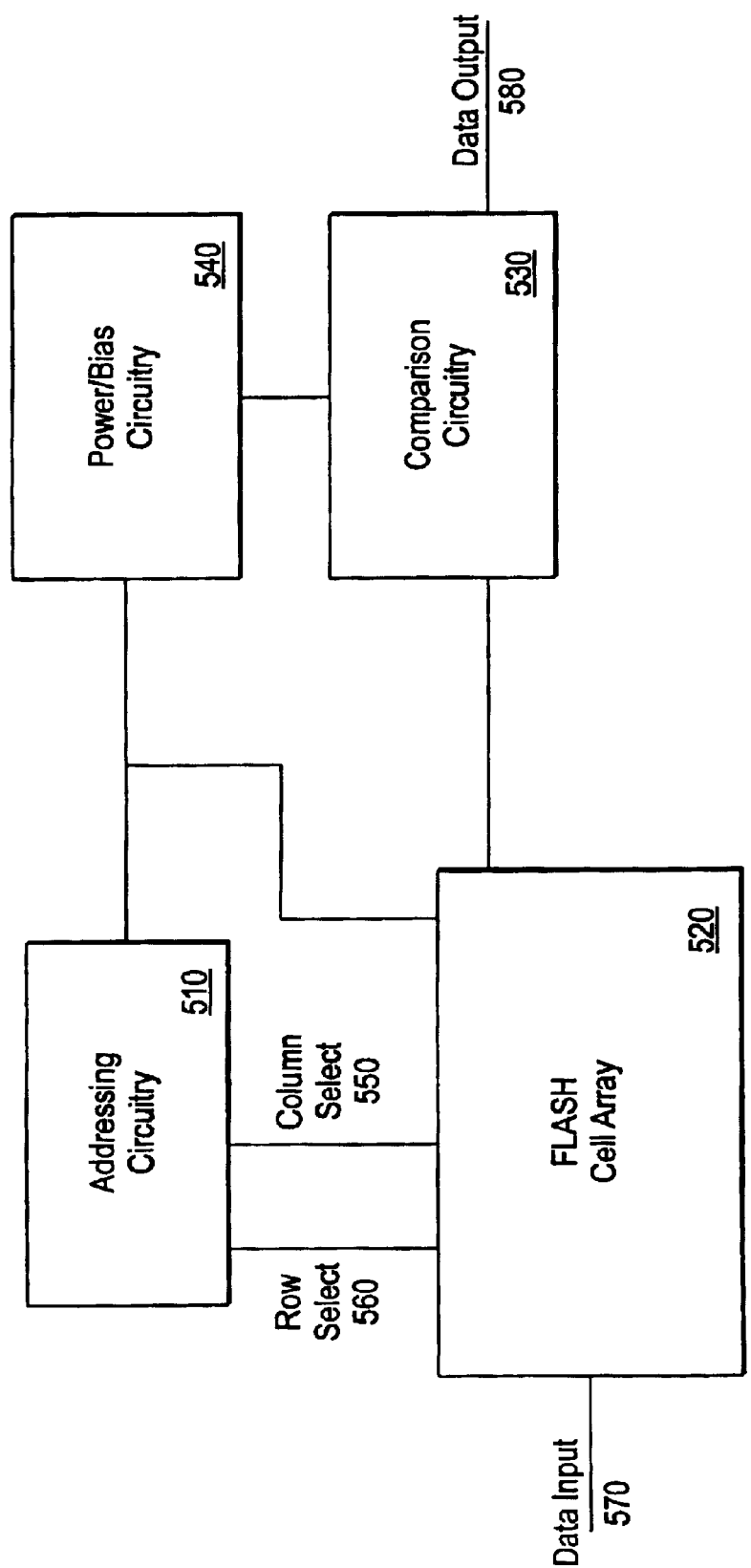
FIG. 5 illustrates an embodiment of a FLASH integrated circuit.

FIG. 5 illustrates an embodiment of a FLASH integrated circuit. Addressing circuitry 510 receives address signals (not shown) and translates those signals into column select 550 and row select 560 (each of which may be implemented as a bus of individual signals in one embodiment). FLASH cell array 520 receives column select 550 and row select 560, and the combination of the two results in selection of a single FLASH cell from the array 520 in one embodiment. FLASH cell array 520 may also receive a data input 570 which is suitable for programming a selected cell. FLASH cell array supplies a signal (voltage/current) to comparison circuitry 530, and the supplied signal is derived from or comes directly from the selected cell. Comparison circuitry receives the signal supplied by FLASH cell array 520, and compares that signal to a reference signal. The comparison results in a data output signal 580 which is generated by comparison circuitry 530. Power and bias circuitry 540 is coupled to each of the other portions of the FLASH integrated circuit, and may supply power and bias voltages and currents. Circuitry 540 may also supply such signals as programming and erase signals as appropriate, and may embody a charge pump for producing voltages greater than a supply voltage of the FLASH integrated circuit.

Figure 6:
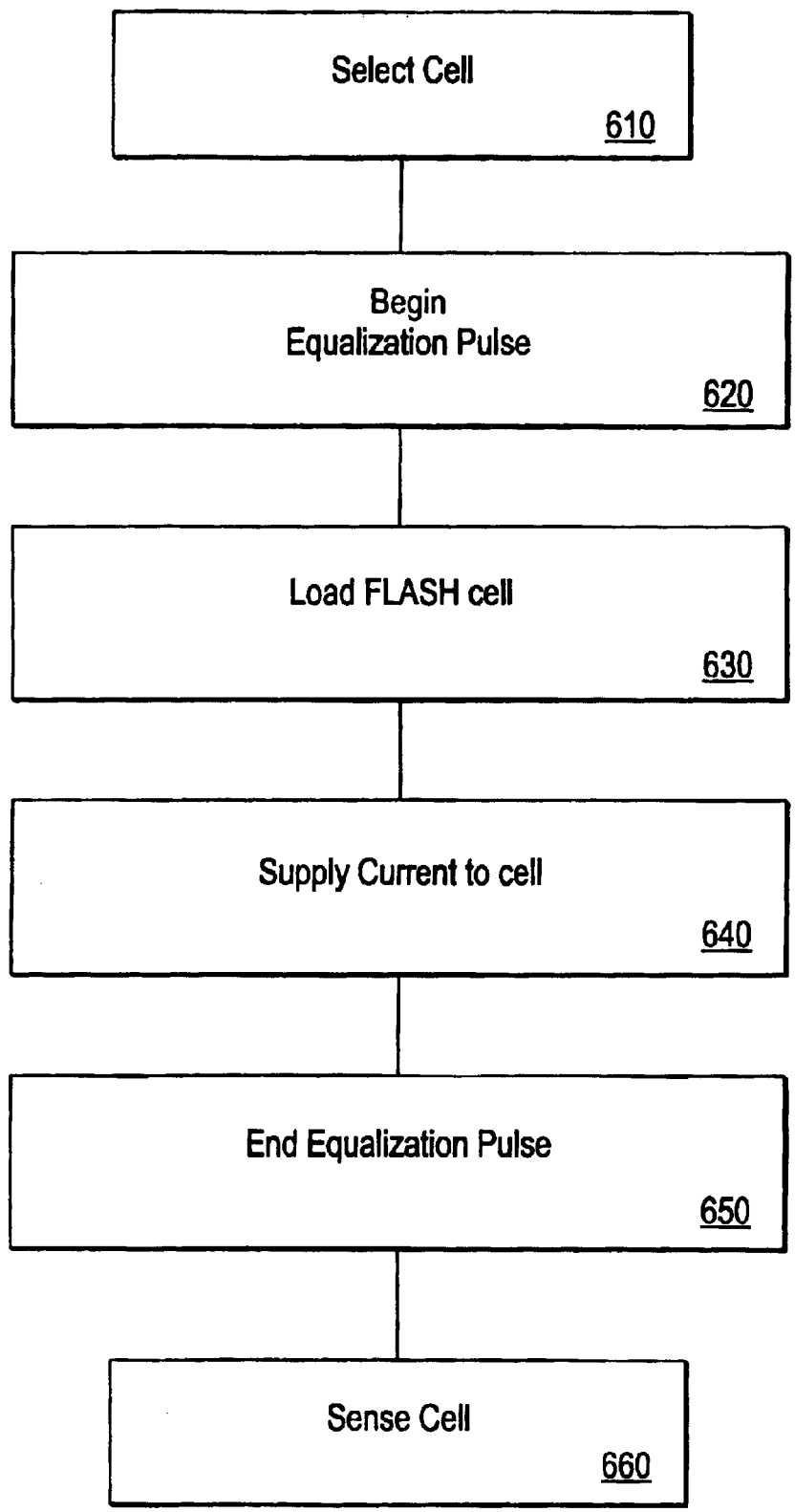
FIG. 6 illustrates an embodiment of a method of sensing a FLASH cell.

Turning to FIG. 6, an embodiment of the method of operation of low voltage sensing in flash memories is illustrated. It will be appreciated that the blocks in FIG. 6 are depicted in serial fashion but may actually be implemented in a parallel or simultaneous fashion. In block 610, the FLASH cell is selected, such as by selecting an appropriate column select signal and thereby connecting a FLASH cell to the sensing apparatus. At block 620, an equalization pulse is begun, causing the inputs used for the FLASH cell to be sensed and the reference FLASH cell to be coupled together and to move substantially together along a V-I curve (a plot of voltage versus current). At block 630, the FLASH cell is loaded by the sensing apparatus, such that the FLASH cell will conduct current from the load to ground if it is programmed in a state to conduct. At block 640, current is supplied from the load to the FLASH cell. At block 650, the equalization pulse is ended, allowing the sense inputs for the reference FLASH cell and FLASH cell to be sensed to decouple. At block 660, the difference in voltage between the connected FLASH cell and a reference FLASH cell is measured, as by a sense amplifier. It will be appreciated that the measurement is a comparison between a voltage level produced by a reference FLASH cell and a voltage level produced by the selected FLASH cell in one embodiment which may involve measurement of both voltage levels. Furthermore, it will be appreciated that loading the FLASH cell (or the reference FLASH cell) may also include supplying current to the FLASH cell (or reference FLASH cell).

By using a column load in conjunction with a current mirror, the measured difference in voltage may be detected relatively easily, as the voltage swing that occurs when the column load reacts to a change in current may be fairly high. Furthermore, by using the equalization pulse, the two inputs may be kept equal during what would normally be a transient condition subject to short-term variations in performance.

In the foregoing detailed description, the method and apparatus of the present invention has been described with reference to specific exemplary embodiments thereof. It will, however, be evident that various modifications and changes may be made thereto without departing from the broader spirit and scope of the present invention. In particular, the advantages conferred by the kicker and the common mode current source may be viewed as separate and cumulative, such that neither is necessarily required in a circuit to derive the advantages conferred by the other. Furthermore, it will be appreciated that a device may be coupled to another device in a direct or an indirect manner, such that the transistor 222 may be said to be coupled both to transistor 225 and to FLASH cell 204. Moreover, with respect to flow diagrams and processes, it will be appreciated that a flow diagram organized in a linear or stepwise fashion may represent operations which may be reorganized to occur in a different order, or to occur in a parallel fashion for example. The present specification and figures are accordingly to be regarded as illustrative rather than restrictive.

What is claimed is:

1. An apparatus comprising:
a first drain bias network having an input suitable to couple to a FLASH cell;
a second drain bias network having an input suitable to couple to a FLASH cell; and
a sense amplifier having a first input, a second input, and an output;
an equalization circuit having a first node coupled to the input of the first drain bias network and having a second node coupled to the input of the second drain bias network and having a control signal to control operation of the equalization circuit by causing the equalization circuit to equalize the first input and the second input of the sense amplifier prior to changes induced by the first drain bias network and the second bias network.

2. The apparatus of claim 1 wherein the first drain bias network has an output coupled to the first input of the sense amplifier and the second drain bias network has an output coupled to the second input of the sense amplifier.

3. The apparatus of claim 2 further comprising:
a reference FLASH cell coupled to the second drain bias network; and
a FLASH cell coupled to the first drain bias network.

4. The apparatus of claim 3 wherein:
the reference FLASH cell coupled to the second drain bias network through a reference column select transistor and the FLASH cell selectively coupled to the first drain bias network through a column select transistor, the column select transistor controlled by a column select signal.

5. The apparatus of claim 2 further comprising:
a FLASH cell coupled to the first drain bias network.

6. The apparatus of claim 5 wherein:
the FLASH cell selectively coupled to the first drain bias network through a first column select transistor.

7. The apparatus of claim 6 further comprising:
a reference FLASH cell coupled through a second column select transistor to the second drain bias network.

8. The apparatus of claim 7 wherein:
the equalization circuit is a transistor having a first node coupled to the input of the first drain bias network and having a second node coupled to the input of the second drain bias network and having a control electrode coupled to a third node of the transistor, the control electrode to deliver the control signal.

9. The apparatus of claim 4 wherein:
the equalization circuit is a transistor having a first node coupled to the input of the first drain bias network and having a second node coupled to the input of the second drain bias network and having a control electrode coupled to a third node of the transistor, the control electrode to deliver the control signal.

10. The apparatus of claim 2 further comprising:
a reference FLASH cell coupled to the second drain bias network.

11. The apparatus of claim 10 wherein:
the reference FLASH cell coupled to the second drain bias network through a reference column select transistor.

12. A method comprising:
equalizing a sense input and a reference input using a single equalizing transistor by causing the equalization transistor to equalize a first input and a second input of a sense amplifier prior to changes being induced by;
coupling the sense input to a FLASH cell to be sensed;
terminating equalization of the sense input and the reference input; and
measuring a sense voltage, the sense voltage corresponding to the sense input.

13. The method of claim 12 further comprising:
selecting the FLASH cell.

14. The method of claim 13 wherein:
coupling further includes loading the FLASH cell with a load.

15. The method of claim 14 further comprising:
coupling the reference input to a reference FLASH cell, including loading the reference FLASH cell;
measuring a reference voltage, the reference voltage corresponding to the reference input; and
comparing the sense voltage and the reference voltage.

16. An apparatus comprising:
a first bias means for biasing a FLASH cell, the first bias means having an input and an output;
a second bias means for biasing a reference FLASH cell, the second bias means having an input and an output; and
a comparison means for comparing the output of the first bias means and the output of the second bias means;
a single equalizing transistor having a first node and a second node, the equalizing transistor coupled to the input of the first bias means and coupled to the input of the second bias means, the equalizing transistor to equalize a first input and a second input of the comparison means prior to changes induced by the first bias means and the second bias means.

17. The apparatus of claim 16 further comprising:
a FLASH cell selectively coupled to the input of the first bias means.

18. The apparatus of claim 17 further comprising:
a reference FLASH cell coupled to the input of the second bias means.

19. The apparatus of claim 18 wherein:
the input of the first bias means is disposed at a first node of the first bias means and the output of the first bias means is also disposed at the first node of the first bias means; and
the input of the second bias means is disposed at a first node of the second bias means and the output of the second bias means is also disposed at the first node of the second bias means.

20. A FLASH device comprising:
a FLASH cell array;
a control circuit block coupled to the FLASH cell array to control the FLASH cell array; and
a comparison circuit block coupled to the FLASH cell array and coupled to the control circuit block, the control circuit block to control the comparison circuit, the comparison circuit including:
a first drain bias network having an input suitable to couple to a FLASH cell,
a second drain bias network having an input suitable to couple to a FLASH cell, and
an equalization circuit having a first node coupled to the input of the first drain bias network and having a second node coupled to the input of the second drain bias network and having a control signal to control operation of the equalization circuit, to cause the equalization circuit to equalize the first input and the second input of the comparison circuit prior to changes induced by the first drain bias network and the second bias network.

21. The FLASH device of claim 20, further comprising:
a sense amplifier having a first input, a second input, and an output; and wherein:
the first drain bias network has an output coupled to the first input of the sense amplifier and the second drain bias network has an output coupled to the second input of the sense amplifier.

22. The FLASH device of claim 21 further comprising:
a reference FLASH cell coupled through a column select transistor to the input of the second drain bias network; and wherein:
a selected FLASH cell of the FLASH cell array selectively coupled through a column select transistor to the input of the first drain bias network.

23. The FLASH device of claim 22 further comprising:
a power supply circuit coupled to the control circuit block and to the FLASH cell array and to the comparison circuit block.

24. An apparatus comprising:
a first bias network having an input suitable to couple to a persistent memory storage location;
a second bias network having an input suitable to couple to a persistent memory storage location; and
a sense amplifier having a first input, a second input, and an output;
an equalization circuit having a first node coupled to the input of the first bias network and having a second node coupled to the input of the second bias network and having a control signal to control operation of the equalization circuit by causing the equalization circuit to equalize the first input and the second input of the comparison circuit prior to changes induced by the first drain bias network and the second bias network.

25. The apparatus of claim 24 wherein the first bias network has an output coupled to the first input of the sense amplifier and the second bias network has an output coupled to the second input of the sense amplifier, the output of the first bias network having a relationship with the input of the first bias network, the output of the second bias network having a relationship with the input of the second bias network.

26. The apparatus of claim 25 further comprising:
a reference persistent memory storage location coupled to the second bias network through a reference column select circuit and the persistent memory storage location selectively coupled to the first bias network through a column select circuit, the column select circuit controlled by a column select signal.

27. An apparatus comprising:
a first drain bias network including:
a first transistor having a first node, a second node and a gate node, the first transistor coupled at its first node to a gate node of a second transistor, to a first node of a third transistor, and to a gate node of a fourth transistor, the first transistor coupled at its second node to ground, and the first transistor coupled at its gate node to a first node of an equalizing transistor and to a first node of the second transistor;
the second transistor having a second node, the second transistor coupled at its second node to a first node of the fourth transistor, to a first node of a fifth transistor, and to a second node of a sixth transistor;
the third transistor having a second node and a gate node, the third transistor coupled at its second node to a power supply, and the third transistor coupled at its gate node to the power supply;
the fourth transistor having a second node, the fourth transistor coupled at its second node to the power supply;
the fifth transistor having a second node and a gate node, the fifth transistor coupled at its second node to the power supply, and the fifth transistor coupled at its gate node to the power supply; and
the sixth transistor having a gate node, the sixth transistor coupled at its gate node to a gate node of a sixth reference transistor, wherein the gate node of the sixth transistor is suitable to be coupled to a control signal;
a second drain bias network including:
a reference column select transistor having a first node, a second node and a gate node, the reference column select transistor coupled at its first node to a reference FLASH cell, the reference column select transistor coupled at its second node to a gate node of a first reference transistor, to a first node of a second reference transistor, and to a second node of the equalizing transistor;
the first reference transistor having a first node and a second node, the first reference transistor coupled at its first node to the gate node of the second reference transistor, to a first node of a third reference transistor, and to a gate node of a fourth reference transistor and the first reference transistor coupled at its second node to ground;
the second reference transistor having a second node, the second reference transistor coupled at its second node to a first node of the fourth reference transistor, to a first node of a fifth reference transistor, and to a second node of a sixth reference transistor;
the third reference transistor having a second node and a gate node, the third reference transistor coupled at its second node to the power supply, and the third reference transistor coupled at its gate node to the power supply;
the fourth reference transistor having a second node, the fourth reference transistor coupled at its second node to the power supply;
the fifth reference transistor having a second node and a gate node, the fifth reference transistor coupled at its second node to the power supply, and the fifth reference transistor coupled at its gate node to the power supply; and
the sixth reference transistor having a first node, the sixth reference transistor coupled at its first node to the power supply; and
a sense amplifier including:
a first input coupled to the second node of the sixth transistor,
a second input coupled to the second node of the sixth reference transistor; and
an output.

28. The apparatus of claim 27 further comprising:
a column select transistor having a first node, a second node and a gate node, the column select transistor suitable to be coupled at its first node to a FLASH cell, the column select transistor coupled at its second node to the gate node of the first transistor, and the column select transistor suitable to be coupled at its gate node to a column select signal.

29. The apparatus of claim 28 further comprising:
a FLASH cell coupled to the first node of the column select transistor.

30. An apparatus comprising:
a reference cell;
a kicker circuit;
a reference kicker circuit coupled to an output of the reference cell;
a first drain bias network coupled to the kicker circuit;
a second drain bias network coupled to the reference kicker circuit;
a sense amplifier with a first input to coupled to an output of the first drain bias network and the sense amplifier with a second input coupled to an output of the second drain bias network; and
an equalizing transistors coupled between an input of the kicker circuit and an input of the reference kicker circuit, having a control signal to control operation of the equalization circuit by causing the equalization circuit to equalize the first input and the second input of the sense amplifier prior to changes induced by the first drain bias network and the second bias network.

31. The apparatus of claim 30 further comprising:
the kicker circuit including:
a first transistor having a first node, a second node and a gate node, the first transistor coupled at its first node to a gate node of a second transistor, to a first node of a third transistor, and to a gate node of a fourth transistor, the first transistor coupled at its second node to ground, and the first transistor coupled at its gate node to a first node of the equalizing transistor and to a first node of the second transistor;
the second transistor having a second node, the second transistor coupled at its second node to the first node of the fourth transistor and to the first drain bias network;
the third transistor having a second node and a gate node, the third transistor coupled at its second node to a power supply, and the third transistor coupled at its gate node to the power supply; and
the fourth transistor having a second node, the fourth transistor coupled at its second node to the power supply; and
the reference kicker circuit including:
a first reference transistor having a first node, a second node and a gate node, the first reference transistor coupled at its first node to a gate node of a second reference transistor, to a first node of a third reference transistor, and to a gate node of a fourth reference transistor, the first reference transistor coupled at its second node to ground, and the first reference transistor coupled at its gate node to a second node of the equalizing transistor and to a first node of the second reference transistor;
the second reference transistor having a second node, the second reference transistor coupled at its second node to a first node of the fourth reference transistor and to the second drain bias network;
the third reference transistor having a second node and a gate node, the third reference transistor coupled at its second node to the power supply, and the third reference transistor coupled at its gate node to the power supply;
the fourth reference transistor having a second node, the fourth reference transistor coupled at its second node to the power supply.

32. The apparatus of claim 31 further comprising:
a column select transistor having a first node, a second node and a gate node, the column select transistor suitable to be coupled at its first node to a FLASH cell, the column select transistor coupled at its second node to the gate node of the first transistor, and the column select transistor suitable to be coupled at its gate node to a column select signal.

33. The apparatus of claim 32 further comprising:
a FLASH cell coupled to the first node of the column select transistor.

* * * * *

UNITED STATES PATENT AND TRADEMARK OFFICE
CERTIFICATE OF CORRECTION

PATENT NO. : 6,717,856 B2 Page 1 of 1
DATED : April 6, 2004
INVENTOR(S) : Srinivasan et al.

It is certified that error appears in the above-identified patent and that said Letters Patent is hereby corrected as shown below:

<u>Column 11,</u>
Line 17, delete "transistors" and insert -- transistor, --.

Signed and Sealed this

First Day of March, 2005

JON W. DUDAS
*Director of the United States Patent and Trademark Office*